United States Patent
Li et al.

(10) Patent No.: US 11,676,892 B2
(45) Date of Patent: Jun. 13, 2023

(54) THREE-DIMENSIONAL METAL-INSULATOR-METAL CAPACITOR EMBEDDED IN SEAL STRUCTURE

(71) Applicant: International Business Machines Corporation, Armonk, NY (US)

(72) Inventors: Baozhen Li, South Burlington, VT (US); Chih-Chao Yang, Glenmont, NY (US); Huimei Zhou, Albany, NY (US); Nan Jing, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/475,717

(22) Filed: Sep. 15, 2021

(65) Prior Publication Data
US 2023/0084798 A1 Mar. 16, 2023

(51) Int. Cl.
*H01L 23/522* (2006.01)
*H01L 23/58* (2006.01)
*H01L 23/528* (2006.01)
*H01L 23/52* (2006.01)
*H01L 49/02* (2006.01)

(52) U.S. Cl.
CPC ........ *H01L 23/5223* (2013.01); *H01L 23/585* (2013.01); *H01L 28/87* (2013.01); *H01L 28/91* (2013.01)

(58) Field of Classification Search
CPC .............................. H01L 28/91; H01L 23/585
See application file for complete search history.

(56) References Cited

U.S. PATENT DOCUMENTS

| | | | |
|---|---|---|---|
| 7,223,654 B2 | 5/2007 | Yang et al. | |
| 8,722,503 B2 | 5/2014 | Korec et al. | |
| 9,449,927 B2 | 9/2016 | Chen et al. | |
| 9,577,025 B2 | 2/2017 | Gu et al. | |
| 9,640,489 B2 | 5/2017 | Hung et al. | |
| 10,062,748 B1 | 8/2018 | Stamper et al. | |
| 10,241,151 B2 | 3/2019 | Sanchez et al. | |
| 2003/0213989 A1* | 11/2003 | Delpech | H01L 28/92 257/532 |
| 2007/0241422 A1 | 10/2007 | Chen | |
| 2013/0292794 A1* | 11/2013 | Pai | H01L 28/91 257/532 |
| 2019/0096800 A1* | 3/2019 | Wei | H01L 28/91 |

(Continued)

*Primary Examiner* — Omar F Mojaddedi
(74) *Attorney, Agent, or Firm* — Cantor Colburn LLP; L. Jeffrey Kelly

(57) ABSTRACT

Embodiments of the present invention are directed to methods and resulting structures for integrated circuits having metal-insulator-metal (MIM) capacitors that serve as both decoupling capacitors and crack stops. In a non-limiting embodiment, an interconnect is formed on a first portion of a substrate in an interior region of the integrated circuit. A second portion of the substrate is exposed in an edge region of the integrated circuit. A MIM capacitor is formed over the second portion of the substrate in the edge region. The MIM capacitor includes two or more plates and one or more dielectric layers. Each dielectric layer is positioned between an adjacent pair of the two or more plates and a portion of the two or more plates extends over the interconnect in the interior region. A plate of the two or more plates is electrically coupled to a last metal wiring level of the interconnect.

8 Claims, 11 Drawing Sheets

(56) References Cited

U.S. PATENT DOCUMENTS

| | | |
|---|---|---|
| 2019/0237553 A1 | 8/2019 | Yu et al. |
| 2019/0378793 A1 | 12/2019 | Cheng et al. |
| 2020/0176552 A1* | 6/2020 | Chang ................. H01L 23/5226 |
| 2020/0411636 A1* | 12/2020 | Kao ........................ H01L 28/91 |

* cited by examiner

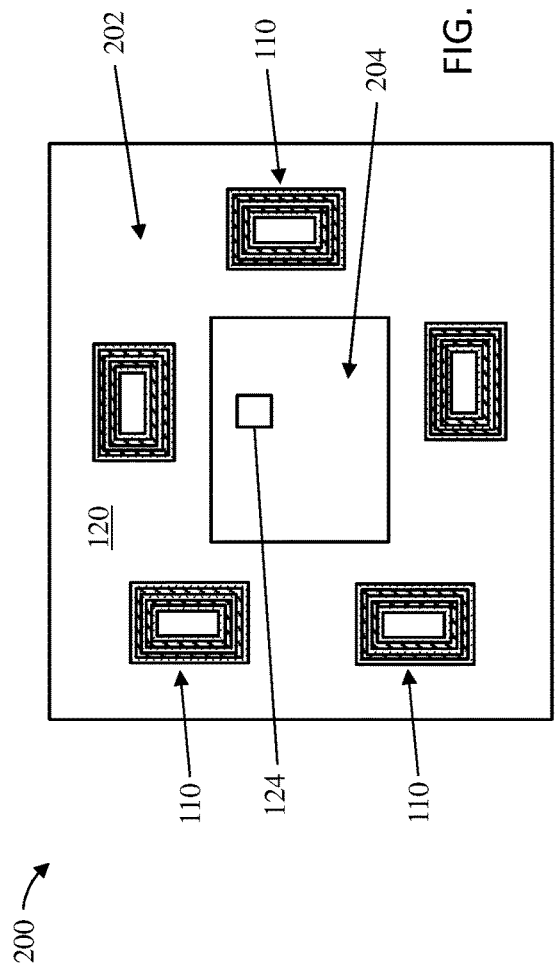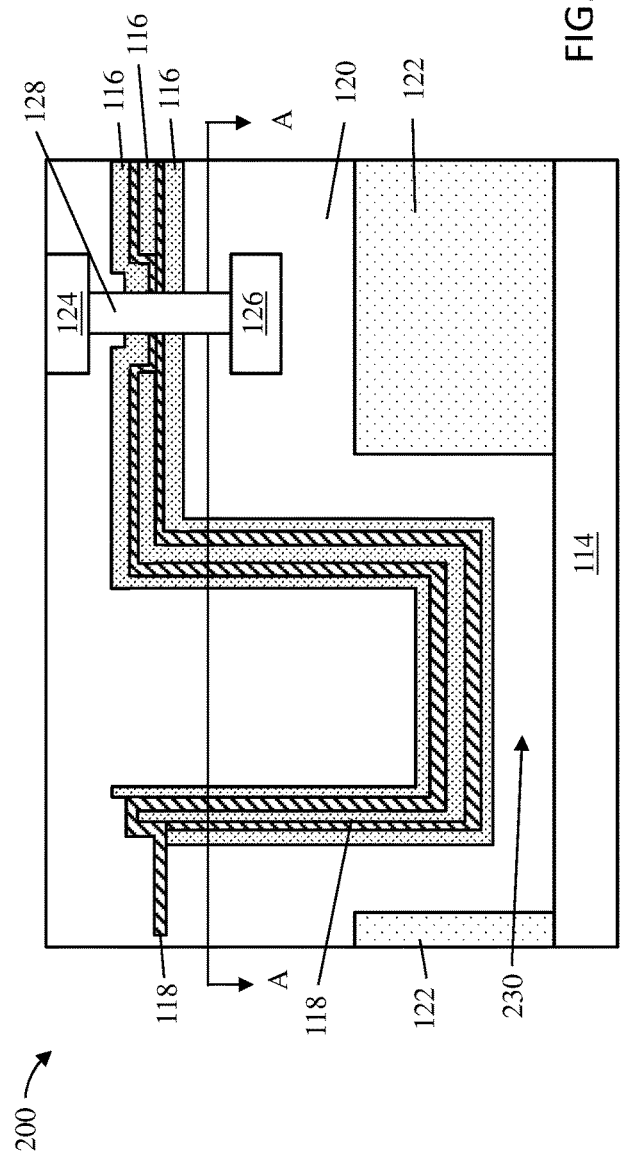

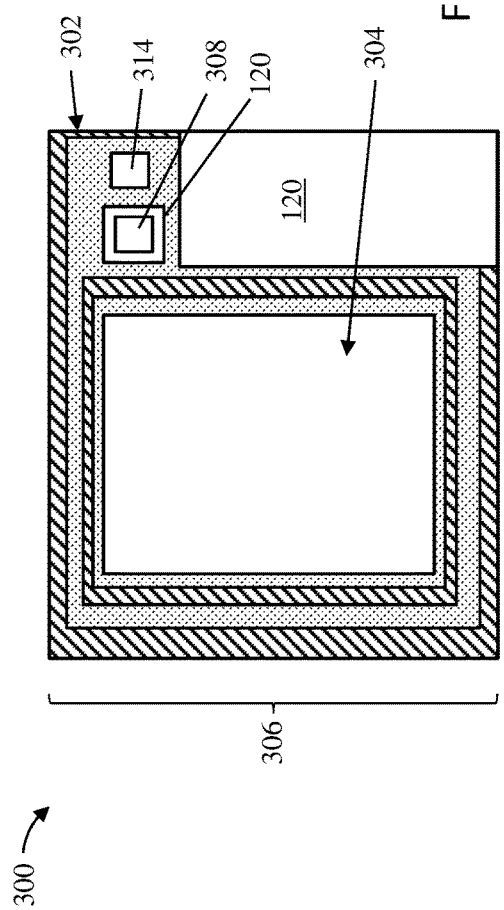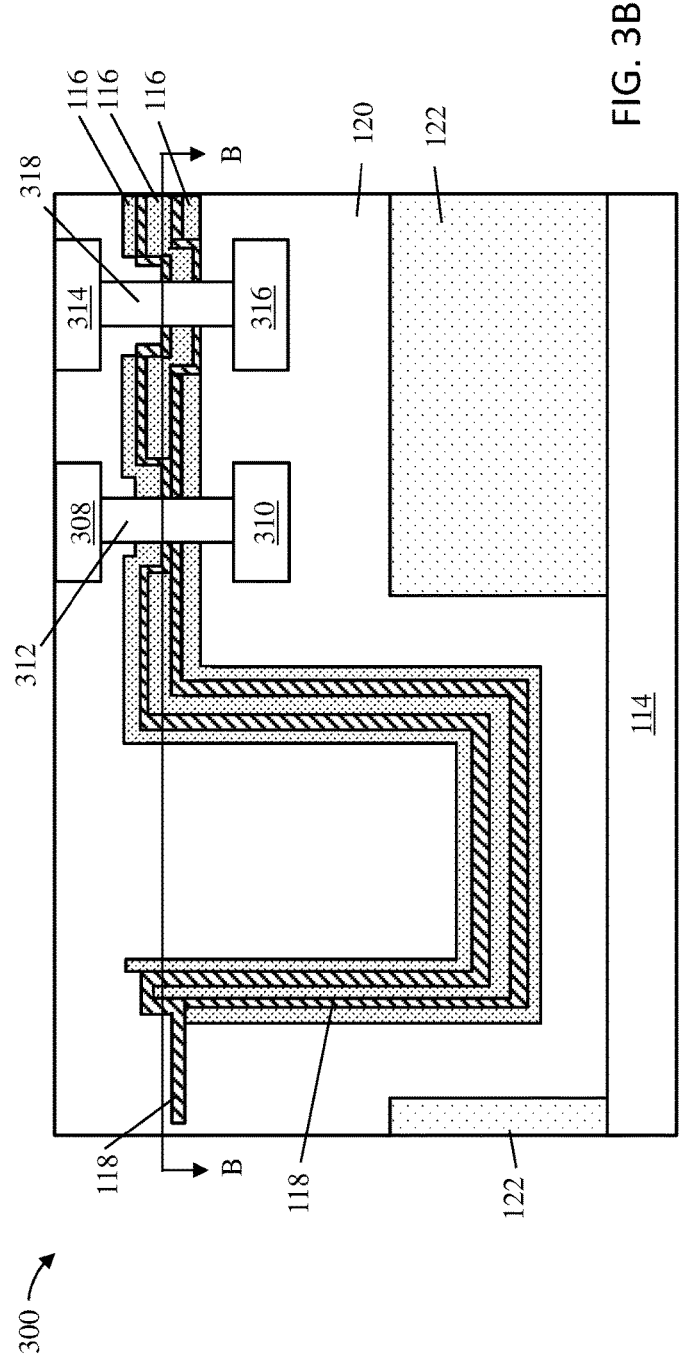

US 11,676,892 B2

THREE-DIMENSIONAL METAL-INSULATOR-METAL CAPACITOR EMBEDDED IN SEAL STRUCTURE

BACKGROUND

The present invention generally relates to fabrication methods and resulting structures for semiconductor devices, and more specifically, to fabrication methods and resulting structures which leverage embedded three-dimensional (3D) metal-insulator-metal capacitors (MIM caps) in a chip seal structure to serve as both decoupling capacitors and crack stops.

Integrated circuits are generally created by forming an array of electronic devices (i.e., transistors, diodes, resistors, capacitors, etc.) and interconnect wiring structures on a semiconductor substrate. Generally, semiconductor devices and gates are formed in a first layer during front-end-of-line (FEOL) processing, followed by formation of interconnect wiring structures in a second layer by BEOL processes. These first and second layers can each contain multiple layers of dielectric material which electrically isolate the devices and interconnect structures. Advanced semiconductor processes utilize dielectric materials with low dielectric constants (known as low-k materials) to minimize interconnect parasitic capacitances.

After a plurality of integrated circuits are formed on a semiconductor wafer, the semiconductor wafer is subjected to a wafer dicing process so as to divide the semiconductor wafer into a plurality of semiconductor chips. The semiconductor chip is then bonded to a substrate package. Due to the poor mechanical strength of the low-k dielectric materials, cracks can form and propagate through the BEOL dielectrics toward the active area of the chip during the wafer dicing and bonding processes, causing chip failure.

SUMMARY

Embodiments of the invention are directed to a method for forming an integrated circuit having metal-insulator-metal (MIM) capacitors that serve as both decoupling capacitors and crack stops. A non-limiting example of the method includes forming an interconnect on a first portion of a substrate in an interior region of the integrated circuit. A second portion of the substrate is exposed in an edge region of the integrated circuit. A MIM capacitor is formed over the second portion of the substrate in the edge region. The MIM capacitor includes two or more plates and one or more dielectric layers. Each dielectric layer is positioned between an adjacent pair of the two or more plates and a portion of the two or more plates extends over the interconnect in the interior region. A plate of the two or more plates is electrically coupled to a last metal wiring level of the interconnect.

Embodiments of the invention are directed to a method for forming an integrated circuit having MIM capacitors that serve as both decoupling capacitors and crack stops. A non-limiting example of the method includes forming a substrate having an interior region and an edge region surrounding an outer perimeter of the interior region and forming a seal ring in the edge region. The seal ring includes a plurality of MIM capacitors.

Embodiments of the invention are directed to an integrated circuit. A non-limiting example of the integrated circuit includes a substrate having an interior region and an edge region surrounding an outer perimeter of the interior region. A seal ring is positioned in the edge region. The seal ring includes a plurality of MIM capacitors.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a top-down view of an IC chip along the line A-A of FIG. 2B during BEOL fabrication operations for forming interconnect structures on the wafer according to one or more embodiments of the invention;

FIG. 2B depicts a cross-sectional view of the IC chip after a processing operation according to one or more embodiments of the invention;

FIG. 3A depicts a top-down view of an IC chip along the line B-B of FIG. 3B during BEOL fabrication operations for forming interconnect structures on the wafer according to one or more embodiments of the invention;

FIG. 3B depicts a cross-sectional view of the IC chip after a processing operation according to one or more embodiments of the invention;

Figure 1A:
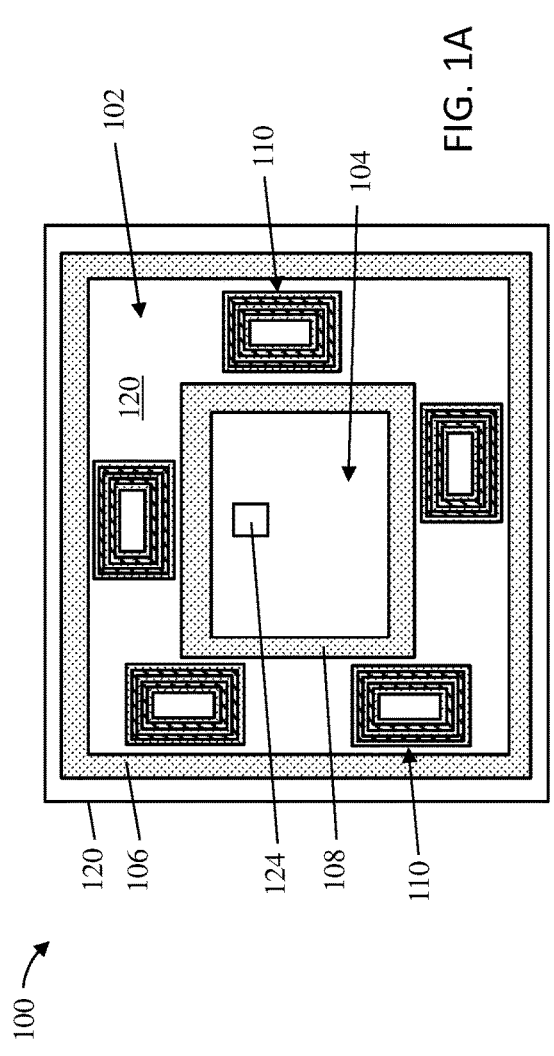
FIG. 1A depicts a top-down view of an integrated circuit (IC) chip along the line A-A of FIG. 1B during BEOL fabrication operations for forming interconnect structures on the wafer according to one or more embodiments of the invention.

The diagrams depicted herein are illustrative. There can be many variations to the diagrams or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular integrated circuit (IC) architecture, embodiments of the invention are not limited to the particular architectures or materials described in this specification. Rather, embodiments of the present invention are capable of being implemented in conjunction with any other type of IC architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. In a multilayered interconnect structure, the metallization layers (lines) are referred to as "M" layers (e.g., M1 layer, M2 layer, etc.) while "V" layers denote the conductive vias placed between adjacent M layers (e.g., V1 is between the M1 and M2 layers).

Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers. Unfortunately, due to the poor mechanical strength of the various low-k dielectric materials preferred for these functions, cracks can form and propagate through the BEOL dielectrics toward the active area of the chip during the wafer dicing and bonding processes, causing chip failure.

Crack stops are physical structures that are incorporated into a semiconductor wafer to enhance the mechanical strength of a BEOL dielectric. A crack stop serves to prevent any cracks in a wafer (e.g., an interlayer dielectric crack formed during a laser ablation) from damaging the active devices positioned behind the crack stop. Crack stops are usually sufficient to protect active devices from the microscopic cracks which occur due to the "weak" dielectric cohesive strength of low-k materials.

Generally, a crack stop (also referred to as a seal ring) is provided for each chip on a wafer. The crack stop includes metal vias and lines, in a similar manner as is found within interconnects. The crack stop serves as a barrier to prevent moisture from diffusing into the chip and prevents cracks (due, e.g., to dicing) from growing into the active area of the chip. Though the crack stop (seal ring) takes a noticeable chip area, it has no electrical functions. In other words, crack stops represent unavoidable area penalties on the chip surface.

Turning now to an overview of aspects of the present invention, one or more embodiments of the invention address the above-described shortcomings of the prior art by providing a new semiconductor structure and a method which leverage embedded 3D MIM capacitors (MIM cap) to serve as both decoupling capacitors and crack stops in a seal structure of a chip. The high frequency and low power of modern semiconductor chips require a lot of decoupling capacitors. While the MIM cap has been a popular solution for decoupling, it takes a lot of valuable chip area. The available chip area, without growing the chip size, is often not sufficient to provide enough decoupling capacitance. Advantageously, leveraging embedded 3D MIM caps to serve as crack stops in a seal structure of a chip serves two purposes simultaneously: providing necessary crack stop functionality while also increasing decoupling capacitance. In other words, embedded 3D MIM caps formed according to one or more embodiments can serve both as crack stops and decoupling capacitors, saving area on the chip surface.

Figure 1B:
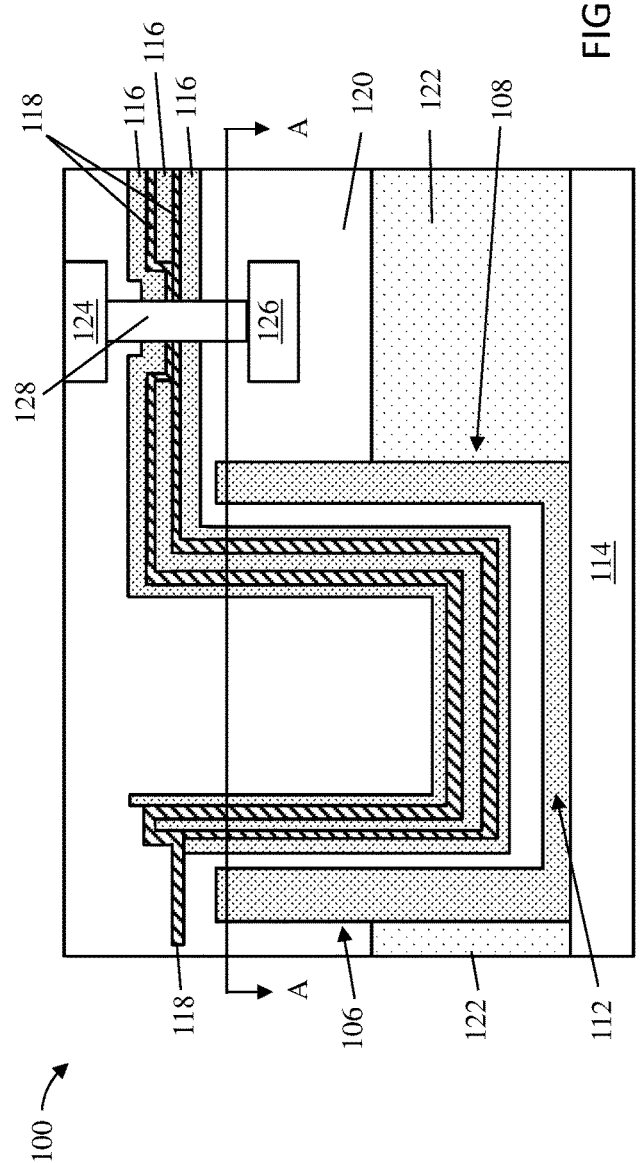
FIG. 1B depicts a cross-sectional view of the IC chip after a processing operation according to one or more embodiments of the invention.

Turning now to a more detailed description of aspects of the present invention, FIG. 1A depicts a top-down view of an IC chip 100 along the line A-A of FIG. 1B during BEOL fabrication operations for forming interconnect structures on the IC wafer 100 according to one or more embodiments of the invention. FIG. 1B depicts a cross-sectional view of the IC chip 100 according to one or more embodiments of the invention.

At the fabrication stage depicted in FIG. 1A, a seal ring 102 (also referred to as a crack stop) is formed around a perimeter of a chip area 104. The chip area 104 has been simplified for ease of illustration and discussion, but includes the various active devices (e.g., transistors, local interconnects, etc.) of the IC chip 100 formed during the FEOL, MOL, and BEOL stages. Moreover, the relative sizes of the seal ring 102 and the chip area 104 have been altered to highlight the seal ring 102. In other words, in some embodiments of the invention, the chip area 104 can encompass a larger surface area (e.g., 60%, 80%, 95%, etc.) of the IC chip 100.

As shown in FIG. 1A, the seal ring 102 includes an outer wall 106, an inner wall 108, and one or more 3D MIM caps 110 positioned between the outer wall 106 and the inner wall 108. Although shown having a particular configuration of MIM caps 110 for ease of discussion, it should be understood that any number of MIM caps can be arbitrarily placed between the outer wall 106 and the inner wall 108. The outer wall 106 and the inner wall 108 can be formed from suitable crack stop materials, such as, for example, metal (e.g., tungsten, titanium, tantalum, ruthenium, zirconium, cobalt, copper, aluminum, gold, silver), metal nitrides and conducting metallic compound materials (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials.

As shown in FIG. 1B, in some embodiments of the invention, the outer wall 106 and the inner wall 108 are coupled (i.e., together define one combined structural element) by a bottom portion 112 that runs along a surface of a substrate 114. The substrate 114 can include any suitable substrate material, such as silicon.

In some embodiments of the invention, each of the MIM caps 110 includes two or more plates 116 (e.g., 2, 3, 4, 5, 10 or more; as shown, 3 plates). The plates 116 can be formed of a variety of metals, such as, for example, titanium nitride, tantalum nitride, tungsten, titanium, tantalum, ruthenium, zirconium, cobalt, copper, aluminum, gold, silver, and alloys thereof. In some embodiments of the invention, the plates 116 can have a thickness of about 4 nm to about 400 nm, although other thicknesses are within the contemplated scope of the disclosure.

In some embodiments of the invention, each adjacent pair of plates 116 is separated by a dielectric layer 118. In some embodiments of the invention, the dielectric layer 118 is a high-k dielectric layer (materials having a high dielectric constant relative to silicon dioxide, i.e., more than 3.9). High-k dielectric materials can be made of, for example, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the dielectric layer 118 can have a thickness of about 0.5 nm to about 4 nm, although other thicknesses are within the contemplated scope of the disclosure. In some embodiments of the invention, the dielectric layer 118 can be a multiple layer stack with a combination of the high-K materials listed above.

In some embodiments of the invention, the bottommost plate of the plates 116 is separated from the bottom portion 112 of the seal ring 102 by a dielectric layer 120. In some embodiments of the invention, the dielectric layer 120 is an interlayer dielectric that includes, for example, silicon oxide, fluorinated silicon oxide, carbon doped oxides, silicon dioxides, silicon nitrides, silicon oxynitrides, silicon carbide (SiC), or other dielectric materials. Any known manner of forming the dielectric layer 120 can be utilized, such as, for example, CVD, PECVD, ALD, flowable CVD, spin-on dielectrics, or PVD.

In some embodiments of the invention, a dielectric layer 122 is formed between the dielectric layer 120 and the substrate 114. In some embodiments of the invention, the dielectric layer 122 is a low-k dielectric (e.g., a low-k ILD).

In some embodiments of the invention, each of the MIM caps 110 are electrically coupled to the chip area 104 by a contact 124 (also referred to as an MIM cap contact). In some embodiments of the invention, the contact 124 is coupled to wiring level 126 of the chip area 104 using a via 128 formed in the respective MIM cap. In some embodiments of the invention, the wiring level 126 is a last metal wiring level of a local interconnect (i.e., an uppermost level of the local interconnect; not separately shown) of the chip area 104. In some embodiments of the invention, the contact 124 is a last metal wiring level of the local interconnect. In some embodiments of the invention, the contact 124 is optional. The contact 124, wiring level 126, and via 128 can be formed from conductive materials that include copper or non-copper metals (e.g., tungsten, titanium, tantalum, ruthenium, zirconium, cobalt, aluminum, platinum), alloys thereof, conducting metallic compound materials (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The contact 124, wiring level 126, and via 128 can be formed from the same or different conductive materials. As further shown in FIG. 1B, in some embodiments of the invention, one or more of the plates 116 (here, the middle plate; others are possible) are electrically isolated from the via 128 by a portion of the dielectric layer 118.

FIG. 2A depicts a top-down view of an IC wafer 200 along the line A-A of FIG. 2B during BEOL fabrication operations for forming interconnect structures on the IC wafer 200 according to one or more embodiments of the invention. FIG. 2B depicts a cross-sectional view of the IC wafer 200 according to one or more embodiments of the invention.

At the fabrication stage depicted in FIG. 2A, a seal ring 202 is formed around a perimeter of a chip area 204. The chip area 204 has been simplified in a similar manner as discussed previously with respect to the chip area 104. As further shown in FIG. 2A, the seal ring 202, in contrast to the seal ring 102 (FIG. 1A), does not include inner/outer walls. Instead, an oxide wall 230 serves in place of the outer wall 106, inner wall 108, and bottom portion 112 discussed with respect to FIG. 1B. The IC wafer 200 is otherwise formed in the same manner as the IC wafer 100 of FIG. 1A.

For example, the seal ring 202 includes MIM caps 110 positioned around a perimeter of the chip area 204 (the shown configuration is not meant to be particularly limiting). In some embodiments of the invention, each of the MIM caps 110 includes two or more plates 116 (e.g., 2, 3, 4, 5, 10 or more; as shown, 3 plates). In some embodiments of the invention, each adjacent pair of plates 116 is separated by a dielectric layer 118. The IC wafer 200 further includes dielectric layers 120, 122, contact 124, wiring level 126, and via 128, configured and arranged as shown (i.e., in a similar manner as discussed with respect to FIGS. 1A and 1B).

In some embodiments of the invention, the bottommost plate of the plates 116 is separated from the substrate 114 by the oxide wall 230. In this manner, the oxide wall 230 and the MIM caps 110 serve as a crack stop and moisture barrier for the chip area 204.

FIG. 3A depicts a top-down view of a BEOL region of an IC wafer 300 along the line B-B of FIG. 3B during BEOL fabrication operations for forming interconnect structures on the IC wafer 300 according to one or more embodiments of the invention. FIG. 3B depicts a cross-sectional view of the IC wafer 300 according to one or more embodiments of the invention.

At the fabrication stage depicted in FIG. 3A, a seal ring 302 is formed around a perimeter of a chip area 304. The chip area 304 has been simplified in a similar manner as discussed previously with respect to the chip areas 104, 204. As further shown in FIG. 3A, the seal ring 302, in contrast to the seal rings 102, 202 (FIGS. 1A and 2A), is configured as a single MIM cap 306 that surrounds the perimeter of a chip area 304. The IC wafer 300 is otherwise formed in a similar manner as the IC wafers 100, 200 of FIGS. 1A and 2A.

For example, the MIM cap 306 includes two or more plates 116 (e.g., 2, 3, 4, 5, 10 or more; as shown, 3 plates). In some embodiments of the invention, each adjacent pair of plates 116 is separated by a dielectric layer 118. The IC wafer 300 further includes dielectric layers 120, 122, and substrate 114, configured and arranged as shown (i.e., in a similar manner as discussed with respect to FIGS. 1A and 1B).

In some embodiments of the invention, the MIM cap 306 is electrically coupled to the chip area 304 by a contact 308 (also referred to as an MIM cap contact). In some embodiments of the invention, the contact 308 is coupled to wiring level 310 of the chip area 304 using a via 312. In some embodiments of the invention, the wiring level 310 is a last metal wiring level of a local interconnect (i.e., an uppermost level of the local interconnect; not separately shown) of the chip area 304. In some embodiments of the invention, the contacts 308, 314 are last metal wiring levels, or optional.

In some embodiments of the invention, a portion of the MIM cap 306 is positioned between the contact 308 and the chip area 304 (as shown). In some embodiments of the invention, the MIM cap 306 is further electrically coupled to the chip area 304 by a contact 314 (also referred to as an MIM cap contact). In some embodiments of the invention, the contact 314 is coupled to a wiring level 316 of the chip area 304 using a via 318. In some embodiments of the invention, the wiring level 316 is the same wiring level as the wiring level 310. In some embodiments of the invention, the wiring level 316 is on a different wiring level than the wiring level 310. The contacts 308, 314, wiring levels 310, 316, and vias 312, 318 can be formed from conductive materials in a similar manner as discussed previously with respect to the contact 124, wiring level 126, and via 128 (FIG. 1B).

The seal ring 302 can be configured with or without optional outer walls and inner walls (as shown, without), as discussed previously with respect to FIGS. 1B (with) and 2B (without), respectively.

Figure 4:
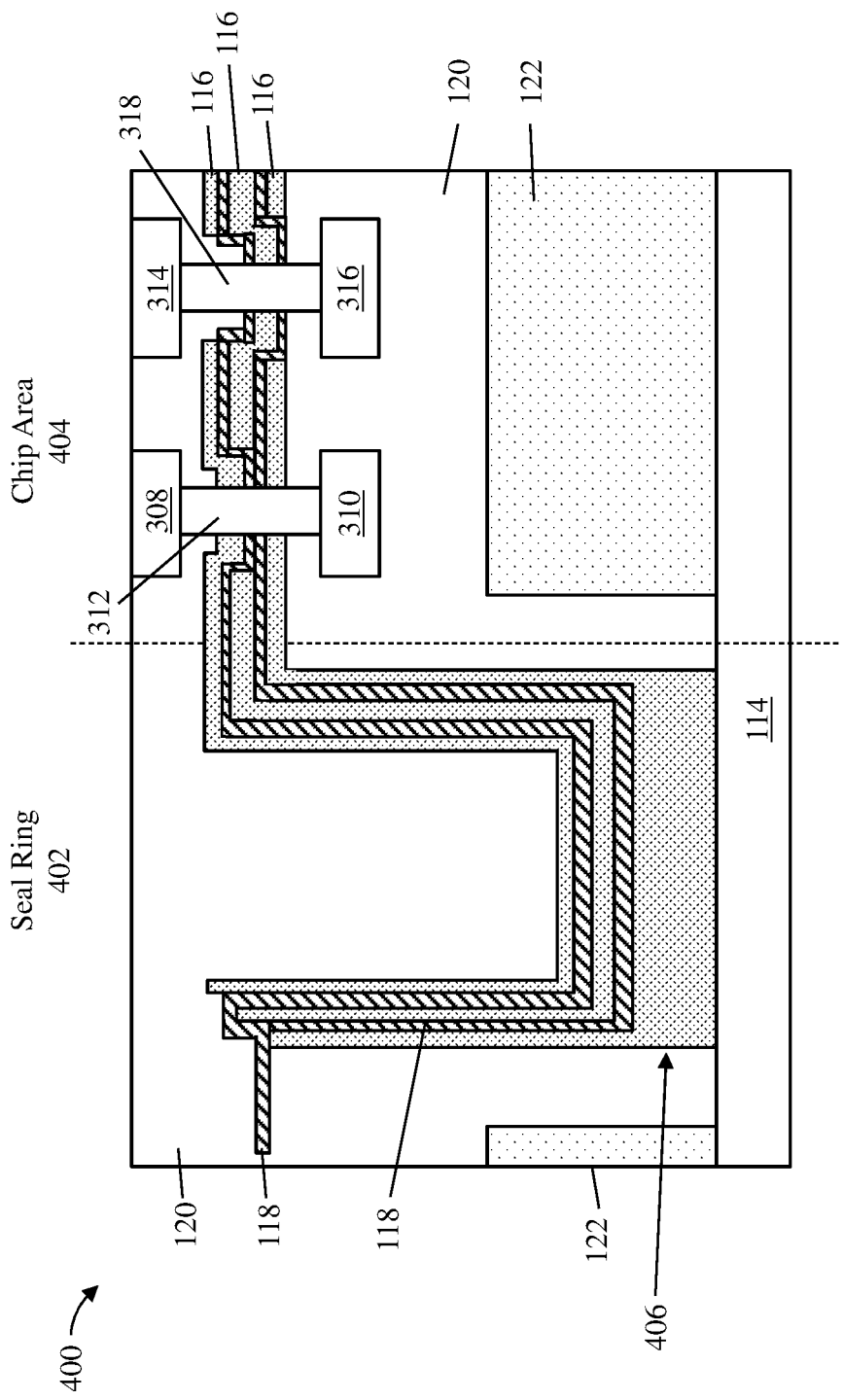
FIG. 4 depicts a cross-sectional view of an IC chip during BEOL fabrication operations for forming interconnect structures on the IC wafer according to one or more embodiments of the invention.

FIG. 4 depicts a cross-sectional view of a BEOL region of an IC wafer 400 during BEOL fabrication operations for forming interconnect structures on the IC wafer 400 according to one or more embodiments of the invention. At the fabrication stage depicted in FIG. 4, a seal ring 402 is formed around a perimeter of a chip area 404. The chip area 404 has been simplified in a similar manner as discussed previously.

As further shown in FIG. 4, the seal ring 402, in contrast to the seal ring 102 (FIG. 1A), does not include inner/outer walls. Instead, a bottommost plate 406 of the plates 116 has been formed to directly contact a surface of the substrate 114. In this manner, the bottommost plate 406 serves in place of the outer wall 106, inner wall 108, and bottom portion 112 discussed with respect to FIG. 1B. The IC wafer 400 is otherwise formed in the same manner as the IC wafer 300 of FIGS. 3A and 3B.

For example, the seal ring 402 includes MIM caps positioned around a perimeter of the chip area 404 (not separately shown). In some embodiments of the invention, each of the MIM caps includes two or more plates 116 (e.g., 2, 3, 4, 5, 10 or more; as shown, 3 plates). In some embodiments of the invention, each adjacent pair of plates 116 is separated by a dielectric layer 118. The IC wafer 400 further includes dielectric layers 120, 122, contacts 308, 314, wiring levels 310, 316, and vias 312, 318, configured and arranged as shown (i.e., in a similar manner as discussed with respect to FIGS. 3A and 3B).

Figure 5:
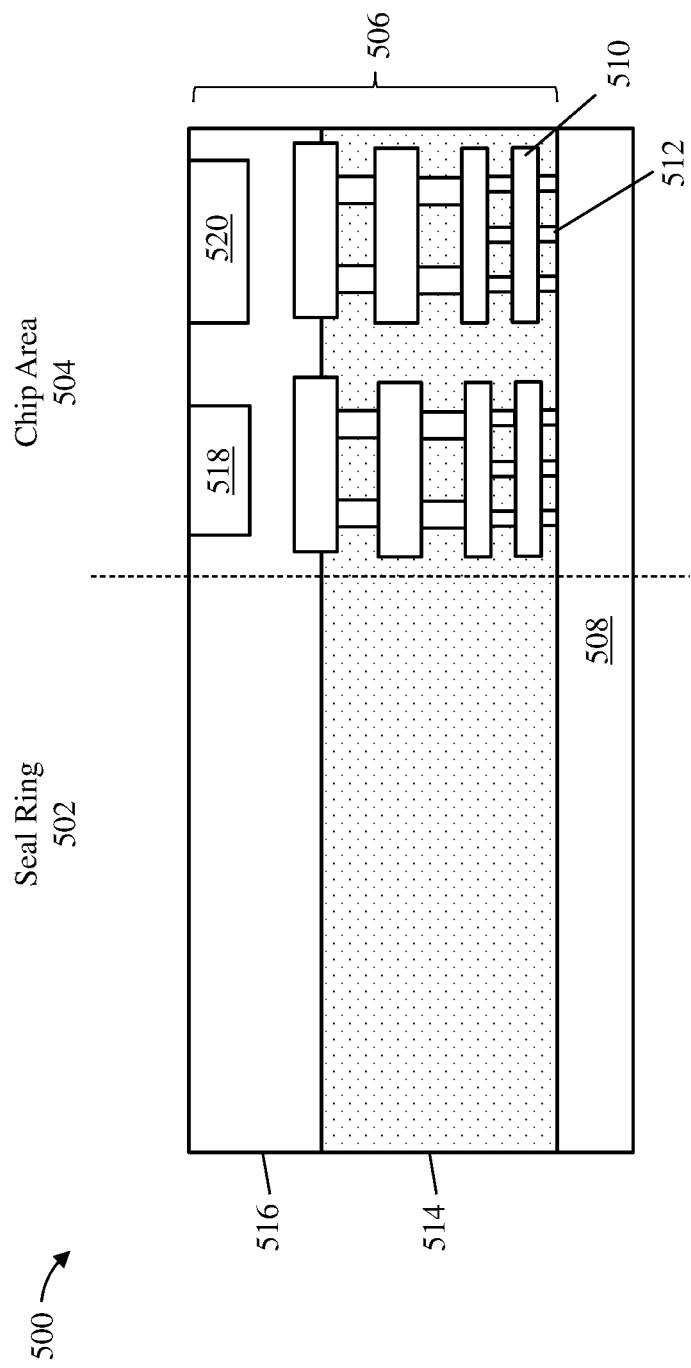
FIG. 5 depicts a cross-sectional view of an IC chip during BEOL fabrication operations for forming interconnect structures on the IC wafer according to one or more embodiments of the invention.

FIG. 5 depicts a cross-sectional view of an IC wafer 500 during BEOL fabrication operations for forming interconnect structures on the IC wafer 100 according to one or more embodiments of the invention. At the fabrication stage depicted in FIG. 5, a seal ring 502 is formed around a perimeter of a chip area 504. The chip area 504 has been simplified for ease of illustration and discussion, but includes the various active devices formed during the FEOL, MOL, and BEOL stages, including an interconnect 506 formed over a substrate 508 (note that the various transistors and other active devices coupled to the interconnect 506 are not separately depicted). The interconnect 506 includes various lines 510 and vias 512 configured to electrically couple the various FEOL devices (e.g., transistors) as needed to provide for logic and other requirements of the IC wafer 500.

In some embodiments of the invention, the interconnect 506 is formed in a dielectric layer 514. In some embodiments of the invention, the dielectric layer 514 is a low-k dielectric (e.g., a low-k ILD). Any known manner of forming the dielectric layer 514 can be utilized, such as, for example, CVD, PECVD, ALD, flowable CVD, spin-on dielectrics, or PVD.

In some embodiments of the invention, a dielectric layer 516 is formed on the dielectric layer 514. In some embodiments of the invention, the dielectric layer 516 is an interlayer dielectric that includes, for example, silicon oxide, fluorinated silicon oxide, low-k dielectrics, ultra-low-k dielectrics, porous silicates, carbon doped oxides, silicon dioxides, silicon nitrides, silicon oxynitrides, silicon carbide (SiC), or other dielectric materials. Any known manner of forming the dielectric layer 516 can be utilized, such as, for example, CVD, PECVD, ALD, flowable CVD, spin-on dielectrics, or PVD.

In some embodiments of the invention, top wiring levels 518, 520 of the interconnect 506 is formed in the dielectric layer 516. In some embodiments of the invention, the top wiring levels 518, 520 are last metal wiring levels of the interconnect 506.

Figure 6:
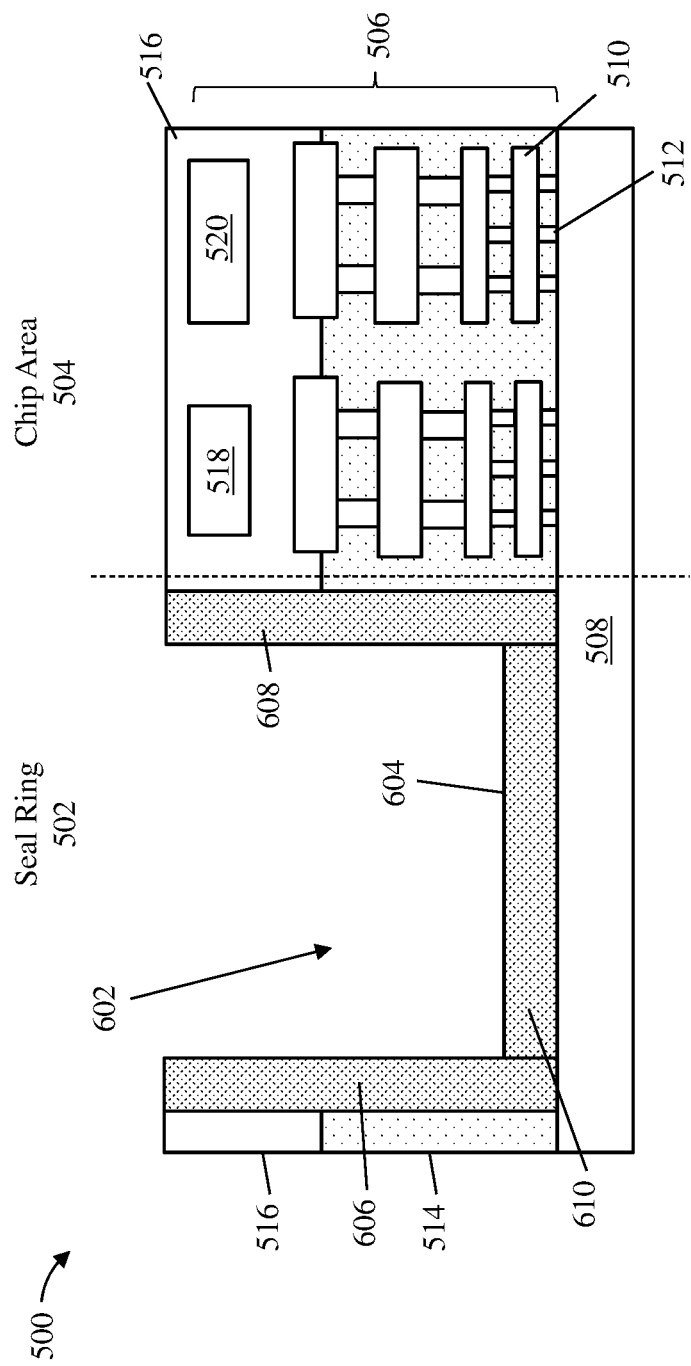
FIG. 6 depicts a cross-sectional view of the IC chip after a processing operation according to one or more embodiments of the invention.

FIG. 6 depicts a cross-sectional view of the IC wafer 500 after a processing operation according to one or more embodiments of the invention. As shown in FIG. 6, in some embodiments of the invention, additional dielectric material is optionally added to the dielectric layer 516 to cover the topmost surface of the top wiring level 518 of the interconnect 506. In some embodiments of the invention, the topmost surface of the top wiring level 518 is not covered by additional dielectric material.

In some embodiments of the invention, portions of the dielectric layers 514, 516 are removed to define a trench 602 that exposes a surface 604 of the substrate 508. The dielectric layers 514, 516 can be removed (patterned) using known processes, such as, for example, a wet etch, a dry etch, or a combination of sequential wet and/or dry etches. In some embodiments of the invention, the surface 604 of the substrate 508 is recessed during this process (sometimes referred to as over etch; not shown).

In some embodiments of the invention, an outer wall 606, an inner wall 608, and a bottom portion 610 of the seal ring 502 are formed in the trench 602. As discussed previously, providing a seal ring that includes an outer wall and an inner wall is optional (e.g., FIG. 1B depicts a seal ring 102 that includes the wall components; FIG. 2B depicts a seal ring 202 that does not). It should be understood that the outer wall 606, inner wall 608, and bottom portion 610 are formed in the trench 602, or not, depending on the desired configuration for the seal ring 502. The outer wall 606, inner wall 608, and bottom portion 610 are omitted from the remaining description of the seal ring 502 for ease of illustration and discussion.

Figure 7:
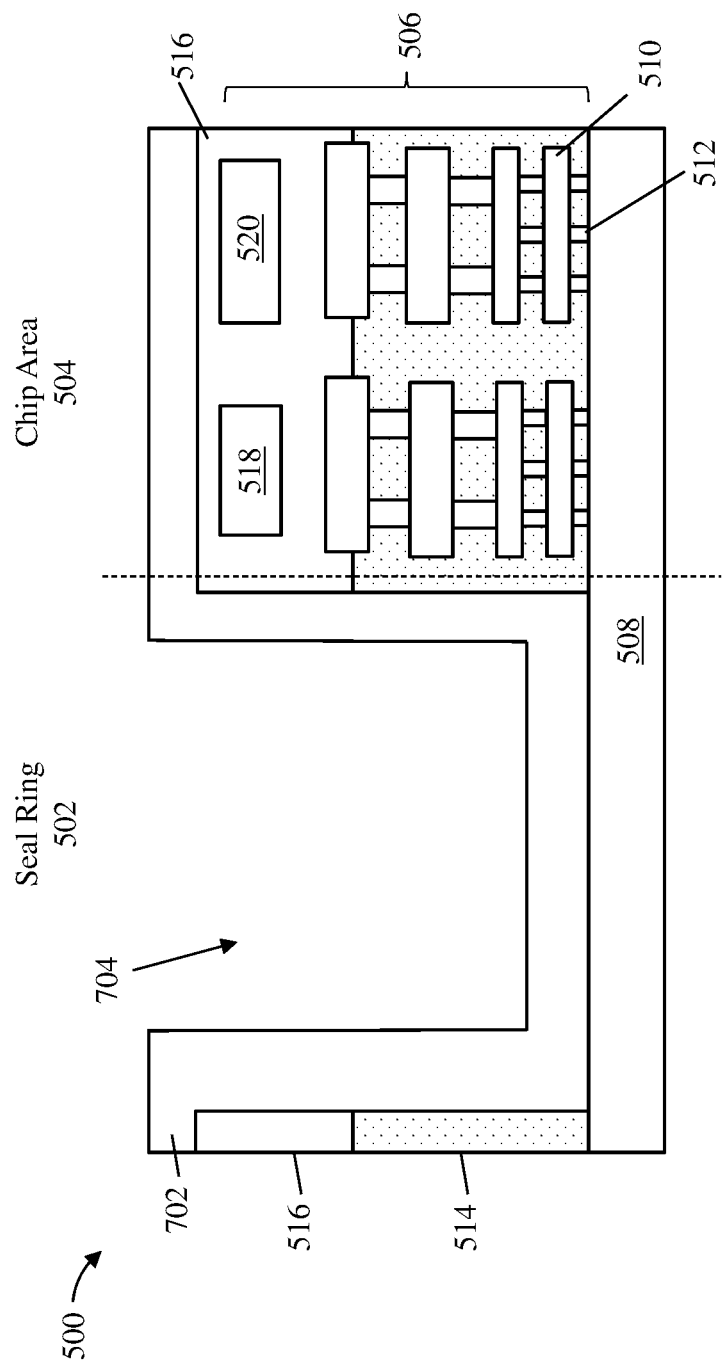
FIG. 7 depicts a cross-sectional view of the IC chip after a processing operation according to one or more embodiments of the invention.

FIG. 7 depicts a cross-sectional view of the IC wafer 500 after a processing operation according to one or more embodiments of the invention. As shown in FIG. 7, in some embodiments of the invention, a dielectric layer 702 is formed over the dielectric layer 516 and the substrate 508.

The dielectric layer 702 can be formed in a similar manner and from similar dielectrics as the dielectric layer 516. Moreover, the dielectric layer 702 can be made of a same or different dielectric material as the dielectric layer 516. In some embodiments of the invention, a portion of the dielectric layer 702 is formed or deposited directly on the substrate 508 (as shown). In some embodiments of the invention (i.e., those having the outer wall 606, the inner wall 608, and the bottom portion 610), the bottom portion 610 is positioned on the substrate 508 and between the substrate 508 and the dielectric layer 702.

In some embodiments of the invention, the dielectric layer 702 is bulk deposited over the dielectric layer 516 and the substrate 508 and portions of the dielectric layer 702 are removed to define a trench 704. Portions of the dielectric layer 702 can be removed using, for example, a wet etch, a dry etch, or a combination of sequential wet and/or dry etches.

Figure 8:
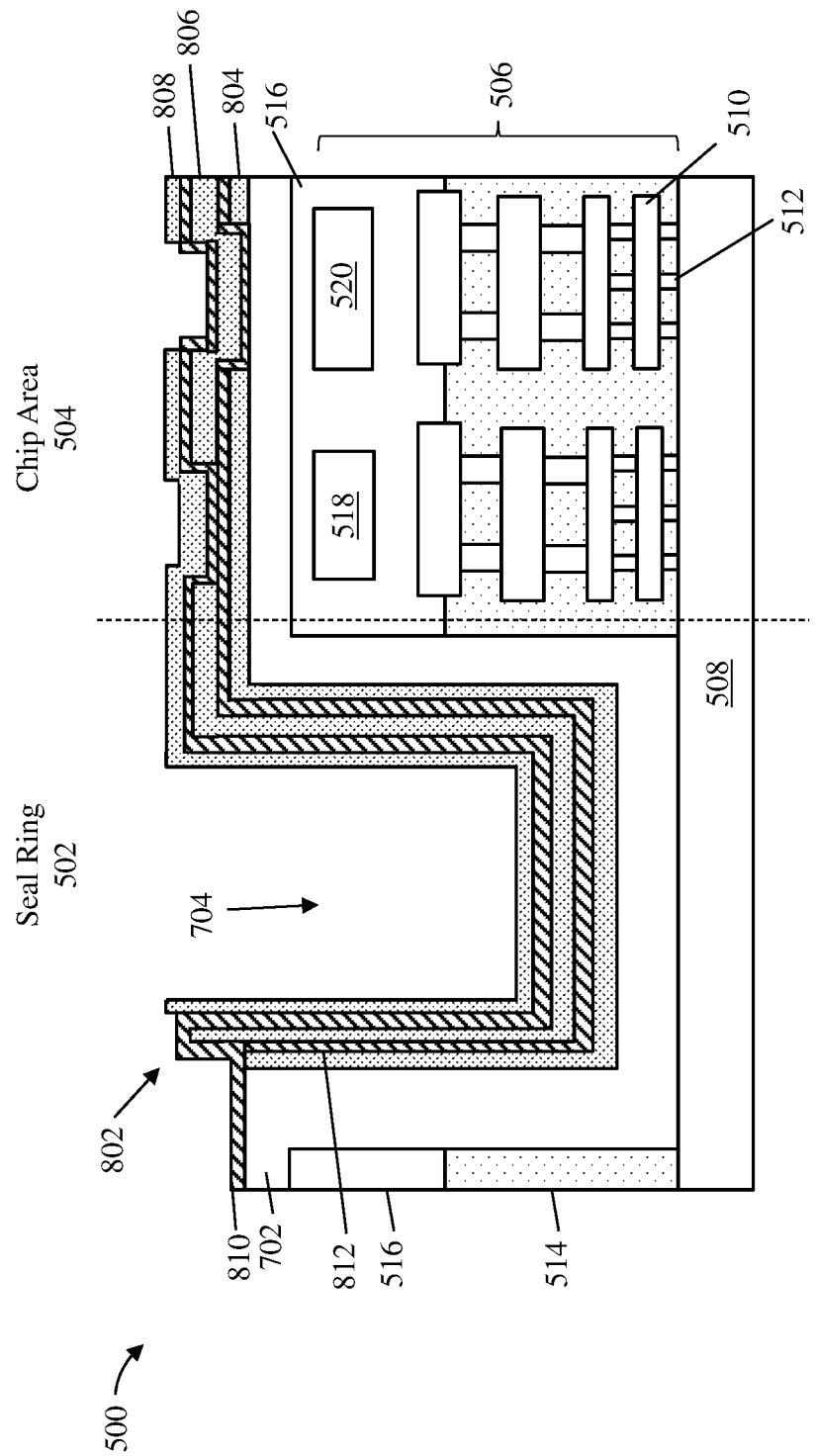
FIG. 8 depicts a cross-sectional view of the IC chip after a processing operation according to one or more embodiments of the invention.

FIG. 8 depicts a cross-sectional view of the IC wafer 500 after a processing operation according to one or more embodiments of the invention. As shown in FIG. 8, an MIM cap 802 is formed in the trench 704. As shown, the MIM cap 802 includes three plates (i.e., bottom plate 804, middle plate 806, top plate 808) and each pair of adjacent plates is separated by a dielectric layer (i.e., top dielectric layer 810, bottom dielectric layer 812). Other MIM cap configurations having more or fewer plates and dielectric layers are possible (e.g., 2, 3, 4, 5, 10 or more plates).

In some embodiments of the invention, the bottom plate 804 is deposited in the trench 704 using known processes, such as CVD, powder metallurgy, PVD, electrodeposition, and electroplating. In some embodiments of the invention, the bottom plate 804 is patterned to expose a portion of the dielectric layer 702 above one or more of the top wiring levels (as shown, the top wiring level 520). The bottom plate 804 can be patterned using known processes, such as, for example, a wet etch, a dry etch, or a combination of sequential wet and/or dry etches. In some embodiments of the invention, the bottom plate 804 is patterned using a RIE selective to the dielectric layer 812.

In some embodiments of the invention, the bottom dielectric layer 812 is formed over the bottom plate 804. In some embodiments of the invention, the bottom dielectric layer 812 is a high-k dielectric conformally deposited using, for example, CVD and PVD.

In some embodiments of the invention, the middle plate 806 is formed over the bottom dielectric layer 812. The middle plate 806 can be formed in a same or similar manner and from same or similar materials as the bottom plate 804. In some embodiments of the invention, the middle plate 806 is patterned to expose a portion of the bottom dielectric layer 812 above one or more of the top wiring levels (as shown, the top wiring level 518). The middle plate 806 can be patterned using known processes, such as, for example, a wet etch, a dry etch, or a combination of sequential wet and/or dry etches. In some embodiments of the invention, the middle plate 806 is patterned using a RIE selective to the dielectric layer 812.

In some embodiments of the invention, the top dielectric layer 810 is formed over the middle plate 806. In some embodiments of the invention, the top dielectric layer 810 is a high-k dielectric conformally deposited using, for example, CVD and PVD. As shown in FIG. 8, in some embodiments of the invention, due to the patterning of the plates 804, 806, a portion of the top dielectric layer 810 is formed directly on the surface of the bottom dielectric layer 812.

In some embodiments of the invention, the top plate 808 is formed over the top dielectric layer 810. The top plate 808 can be formed in a same or similar manner and from same or similar materials as the bottom plate 804. In some embodiments of the invention, the top plate 808 is patterned to expose a topmost portion (upper high-k portion) of the top dielectric layer 810 above one or more of the top wiring levels (as shown, the top wiring level 520). The top plate 808 can be patterned using known processes, such as, for example, a wet etch, a dry etch, or a combination of sequential wet and/or dry etches. In some embodiments of the invention, the top plate 808 is patterned using a RIE that punches through the top dielectric layer 810.

Figure 9:
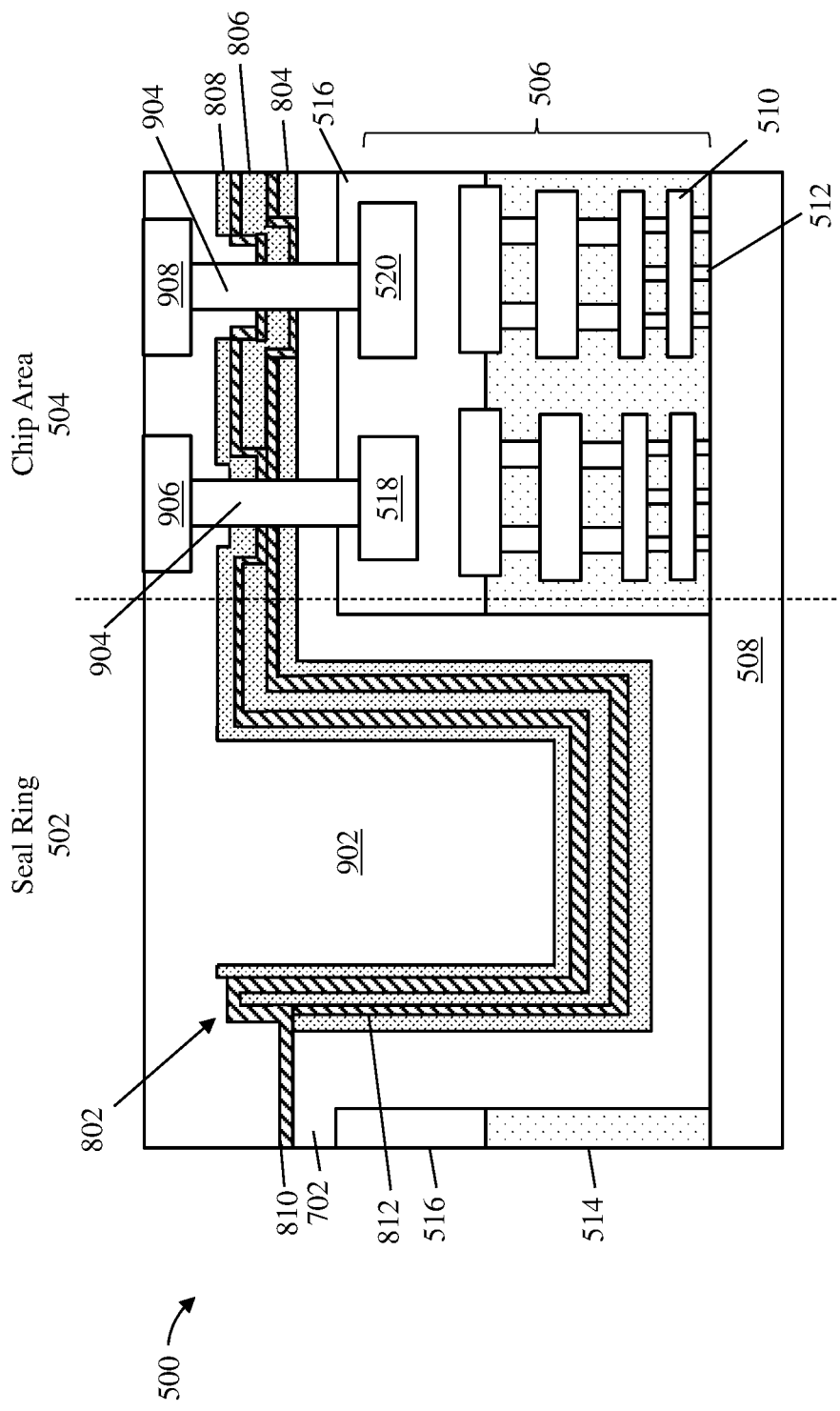
FIG. 9 depicts a cross-sectional view of the IC chip after a processing operation according to one or more embodiments of the invention.

Patterning the plates 804, 806, 808 as described allows for control over how many of the plates 804, 806, 808 directly contact MIM cap vias (see FIG. 9). For example, the plates 804, 806, 808 can be patterned to ensure that a first via contacts 2 plates, while a second via contacts 1 plate (or 3 plates, etc.) or vice versa.

In some embodiments of the invention, the MIM cap 802 is formed concurrently with one or more additional MIM caps (not separately shown) in the chip area 504. The additional MIM caps can include conventional decoupling capacitors formed in the chip area 504.

FIG. 9 depicts a cross-sectional view of the IC wafer 500 after a processing operation according to one or more embodiments of the invention. As shown in FIG. 9, a dielectric layer 902 can be formed over the IC wafer 500. The dielectric layer 902 can be formed using any suitable dielectric material. In some embodiments of the invention, the dielectric layer 902 is an interlayer dielectric made of an oxide, such as silicon oxide.

In some embodiments of the invention, the dielectric layer 902, the plates 804, 806, 808, and the dielectric layers 810, 812 are patterned to create trenches (not separately shown) which are filled with conductive material to define one or more vias 904. The layers can be patterned using known processes, such as, for example, a wet etch, a dry etch, or a combination of sequential wet and/or dry etches. The vias 904 can be formed of a same or similar manner as the vias (e.g., via 128) described previously.

In some embodiments of the invention, the MIM cap 802 is electrically coupled to the chip area 504 by one or more contacts 906, 908 (MIM cap contacts). In some embodiments of the invention, the contacts 906, 908 are coupled to wiring levels 518, 520 respectively, using the vias 904. As discussed previously, all or a subset of the plates 804, 806, 808 of the MIM cap 802 can directly contact the vias 904.

Consequently, all or a subset of the plates 804, 806, 808 can be electrically coupled to the contacts 906, 908. As shown, the bottom plate 804 is electrically coupled to the contact 906, the middle plate 806 is electrically coupled to the contact 908, and the top plate 808 is electrically coupled to the contact 906. Other configurations are possible and within the contemplated scope of the disclosure. For example, in some embodiments of the invention, one or both of contacts 906, 908 are last metal wiring levels, or optional.

Figure 10:
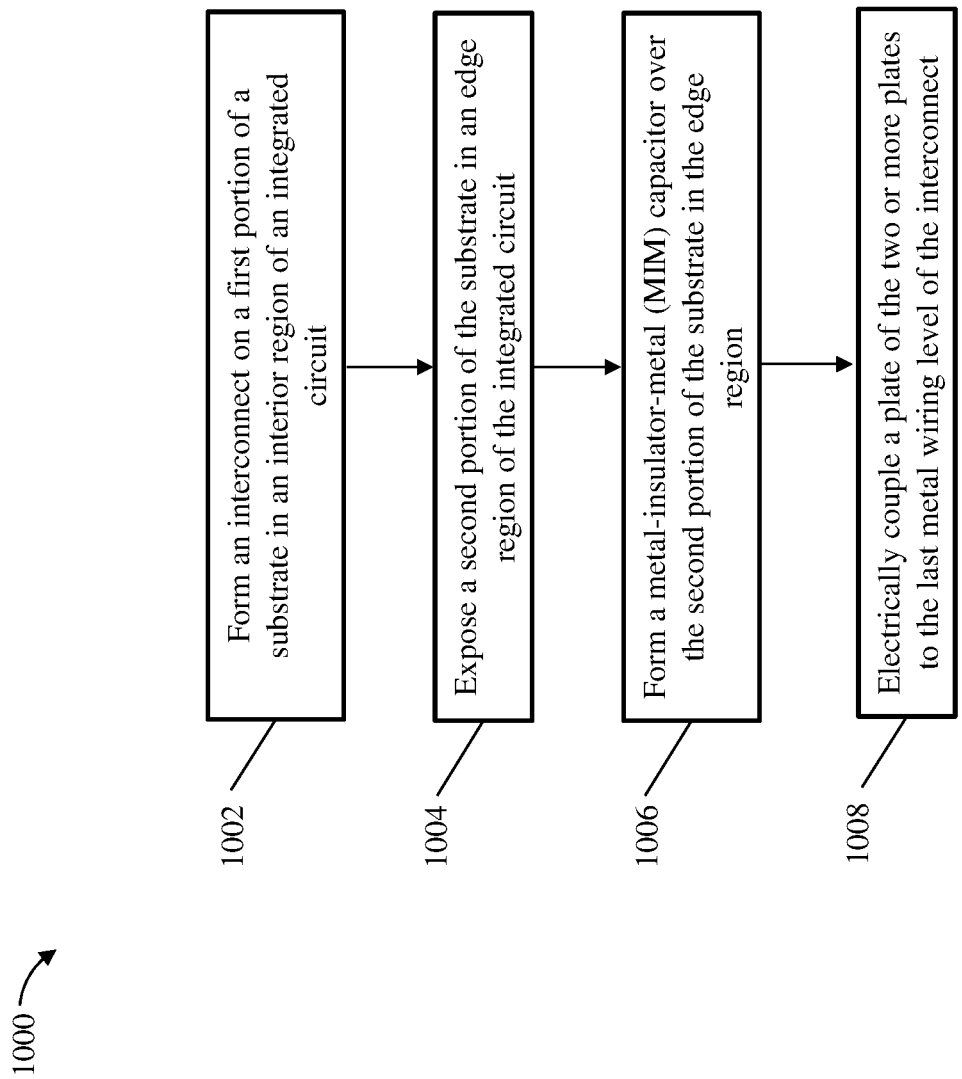
FIG. 10 depicts a flow diagram illustrating a method according to one or more embodiments of the invention.

FIG. 10 depicts a flow diagram 1000 illustrating a method for leveraging 3D MIM capacitors as both decoupling capacitors and crack stops in a seal structure of a chip according to one or more embodiments of the invention. As shown at block 1002, an interconnect is formed on a first portion of a substrate in an interior chip region of the integrated circuit. In some embodiments of the invention, the interconnect includes a last metal wiring level.

At block 1004, a second portion of the substrate is exposed in a chip edge region of the integrated circuit. In some embodiments of the invention, exposing the second portion of the substrate includes forming a trench. In some embodiments of the invention, a metal wall is formed on sidewalls and a bottom surface of the trench. In some embodiments of the invention, the metal wall is between the MIM capacitor and the substrate. In some embodiments of the invention, the metal wall and the MIM capacitor together define a seal ring positioned around an outer perimeter of the interior region. In some embodiments of the invention, a dielectric wall is formed on sidewalls and a bottom surface of the trench. In some embodiments of the invention, the dielectric wall is between the MIM capacitor and the substrate.

At block 1006, a MIM capacitor is formed over the second portion of the substrate in the edge region. In some embodiments of the invention, the MIM capacitor includes two or more plates (e.g., 2, 3, 6, 10, 20, etc.) and one or more dielectric layers positioned between adjacent pairs of the two or more plates. In some embodiments of the invention, a portion of the two or more plates extends over the interconnect in the interior region. In some embodiments of the invention, the MIM capacitor is configured both as a decoupling capacitor and as a crack stop for the integrated circuit.

At block 1008, a plate of the two or more plates is electrically coupled to the last metal wiring level of the interconnect. In some embodiments of the invention, a contact is formed over the last metal wiring level and a via is formed between the contact and the last metal wiring level. In some embodiments of the invention, a portion of the via is in direct contact with the plate. In some embodiments of the invention, a second plate of the two or more plates is electrically isolated from the via.

Figure 11:
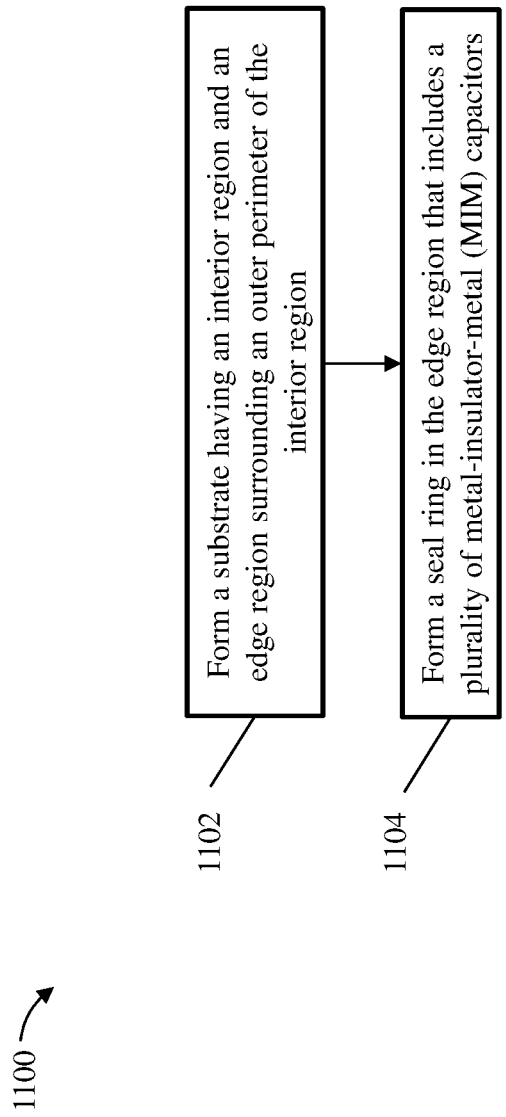
FIG. 11 depicts a flow diagram illustrating a method according to one or more embodiments of the invention.

FIG. 11 depicts a flow diagram 1100 illustrating a method for leveraging 3D MIM capacitors as both decoupling capacitors and crack stops in a seal structure of a chip according to one or more embodiments of the invention. As shown at block 1102, a substrate having an interior region and an edge region surrounding an outer perimeter of the interior region is formed.

At block 1004, a seal ring is formed in the chip edge region. In some embodiments of the invention, the seal ring includes a plurality of MIM capacitors. In some embodiments of the invention, each MIM capacitor includes two or more plates (e.g., 2, 3, 6, 10, 20, etc.) and one or more dielectric layers positioned between adjacent pairs of the two or more plates. In some embodiments of the invention, a portion of the two or more plates extends over the interconnect in the interior region. In some embodiments of the invention, each MIM capacitor is configured both as a decoupling capacitor and as a crack stop for the integrated circuit.

In some embodiments of the invention, the seal ring further includes an outer wall and an inner wall. In some embodiments of the invention, the outer wall and the inner wall are metal walls. In some embodiments of the invention, the outer wall and the inner wall are dielectric walls. In some embodiments of the invention, each of the MIM capacitors is positioned between the outer wall and the inner wall. In some embodiments of the invention, each of the MIM capacitors is electrically coupled to a last metal wiring level of the interconnect.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA).

Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming an integrated circuit, the method comprising:

forming an interconnect on a first portion of a substrate in an interior region of the integrated circuit, the interconnect comprising a last metal wiring level, the interconnect further comprising one or more metal lines and one or more vias electrically coupled to a front end of line (FEOL) device;

forming a trench exposing a second portion of the substrate in an edge region of the integrated circuit, the trench in the edge region adjacent to the interconnect in the interior region;

forming a metal-insulator-metal (MIM) capacitor over the second portion of the substrate in the edge region, the MIM capacitor comprising two or more plates and one or more dielectric layers, wherein each dielectric layer is positioned between an adjacent pair of the two or more plates, and wherein a portion of the two or more plates extends over the interconnect in the interior region; and electrically coupling a plate of the two or more plates to the last metal wiring level of the interconnect.

2. The method of claim 1, wherein the MIM capacitor is configured both as a decoupling capacitor and as a crack stop for the integrated circuit.

3. The method of claim 1, wherein exposing the second portion of the substrate comprises forming a trench.

4. The method of claim 3 further comprising forming a metal wall on sidewalls and a bottom surface of the trench, the metal wall between the MIM capacitor and the substrate.

5. The method of claim 4, wherein the metal wall and the MIM capacitor together define a seal ring positioned around an outer perimeter of the interior region.

6. The method of claim 3 further comprising forming a dielectric wall on sidewalls and a bottom surface of the trench, the dielectric wall between the MIM capacitor and the substrate.

7. The method of claim 1, wherein electrically coupling the plate of the two or more plates to the last metal wiring level comprises:

forming a contact over the last metal wiring level; and forming a via between the contact and the last metal wiring level;

wherein a portion of the via is in direct contact with the plate.

8. The method of claim 7, wherein a second plate of the two or more plates is electrically isolated from the via.

* * * * *